(12) United States Patent
Huber et al.

(10) Patent No.: US 8,605,526 B2
(45) Date of Patent: Dec. 10, 2013

(54) MEMORY RELIABILITY VERIFICATION TECHNIQUES

(75) Inventors: Peter Huber, Neubiberg (DE); Joel Hatsch, Holzkirchen (DE); Karl Hofmann, Munich (DE); Siegmar Koeppe, Munich (DE)

(73) Assignee: Infineon Technologies AG, Neubiberg (DE)

( * ) Notice: Subject to any disclaimer, the term of this patent is extended or adjusted under 35 U.S.C. 154(b) by 210 days.

(21) Appl. No.: 13/118,687

(22) Filed: May 31, 2011

(65) Prior Publication Data

US 2012/0307579 A1    Dec. 6, 2012

(51) Int. Cl.
*G11C 7/00* (2006.01)
*G11C 29/00* (2006.01)

(52) U.S. Cl.
USPC ....... 365/201; 365/154; 365/189.11; 365/203

(58) Field of Classification Search
USPC ............. 365/154 X, 189.011, 189.11 X, 190, 365/201 O, 203 X
See application file for complete search history.

(56) References Cited

U.S. PATENT DOCUMENTS

| | | | | |
|---|---|---|---|---|
| 4,852,064 A * | 7/1989 | Kim et al. | | 365/203 |
| 5,936,892 A * | 8/1999 | Wendell | | 365/189.03 |
| 7,561,483 B2 * | 7/2009 | Joshi et al. | | 365/201 |
| 2006/0218455 A1 * | 9/2006 | LeClair et al. | | 714/726 |

OTHER PUBLICATIONS

"Embedded Memory BIST." 22 Pages.
Wu, Cheng-Wen. "Memory Built-In Self-Test." 90 Pages.
"Embedded Memory BIST." 22 Pages, Dec. 13, 2003.

* cited by examiner

*Primary Examiner* — Vanthu Nguyen
(74) *Attorney, Agent, or Firm* — Eschweiler & Associates, LLC (57) ABSTRACT

Rather than merely carrying out a BIST test by verifying whether a memory cell accurately stores a "1" or "0" under normal read/write conditions, aspects of the present discloser relate to BIST tests that test the read and/or write margins of a cell. During this BIST testing, the read and/or write margins can be incrementally stressed until a failure point is determined for the cell. In this way, "weak" memory cells in an array can be identified and appropriate action can be taken, if necessary, to deal with these weak cells.

20 Claims, 6 Drawing Sheets

MEMORY RELIABILITY VERIFICATION TECHNIQUES

BACKGROUND

Semiconductor memories store digitally encoded data for personal computer systems, embedded processor-based systems, video imaging circuits, communication devices, and the like.

Typically, memory devices include an array of memory cells arranged in a series of columns and rows, wherein each memory cell includes a data storage element that stores at least one bit of data (e.g., a logical "1" or a logical "0"). Although these data storage elements provide generally reliable data retention, data errors can occur in some situations. Such a data error, for example, can cause a logical "1" that was expected to have been written to a cell to be read as a logical "0", or vice versa. Because data errors can lead to undesirable consequences in the system, engineers strive to limit the number of data errors in memory devices.

Built-in-self-test (BIST) modules are one technology that has been developed to limit or prevent data errors. BIST modules typically write a pattern of "1"s and/or "0"s into the array, and then subsequently read the memory cells of the array to check whether the same pattern of "1"s and/or "0"s are read back. Often BIST testing is carried out before the memory devices are shipped to end customers (e.g., BIST testing is carried out in a fabrication facility), however, BIST testing can also be performed from time to time after customers have used the devices. In either case, if a faulty cell is identified, the BIST module can map the address of the faulty cell to that of a redundant (reliable) memory cell, such that memory operations intended to access the faulty cell are, unbeknownst to the end user, re-routed to the redundant (reliable) cell. This helps to ensure the end user receives a reliable memory device that accurately stores data.

Although conventional BIST methods are useful, the inventors have appreciated that more detailed information about the reliability of the memory cells of the array would be beneficial in many instances. For example, the inventors have appreciated that it would be helpful to generate data about read and/or write margins for the memory cells to help ward off future data errors due to "weak" memory cells. Accordingly, aspects of the present disclosure provide for techniques for verifying the reliability of memory cells.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. For example, some concepts in accordance with aspects of the invention are described below with regards to a static random access memory (SRAM) device, but it will be appreciated that these concepts are also applicable to other memory devices that make use of cross-coupled inverters, such as single-port (SP) SRAM, dual port (DP) SRAM, or other multi-port SRAM devices.

Some embodiments of the present disclosure relate to improved reliability verification techniques for semiconductor memories. Rather than merely carrying out a BIST test by verifying whether a memory cell accurately stores a "1" or "0" under normal read/write conditions, aspects of the present invention relate to BIST tests that test the read and/or write margins of a cell. During this BIST testing, the read and/or write margins can be incrementally stressed until a failure point is determined for the cell. In this way, "weak" memory cells in an array can be identified and appropriate action can be taken, if necessary, to deal with these weak cells.

Figure 1:
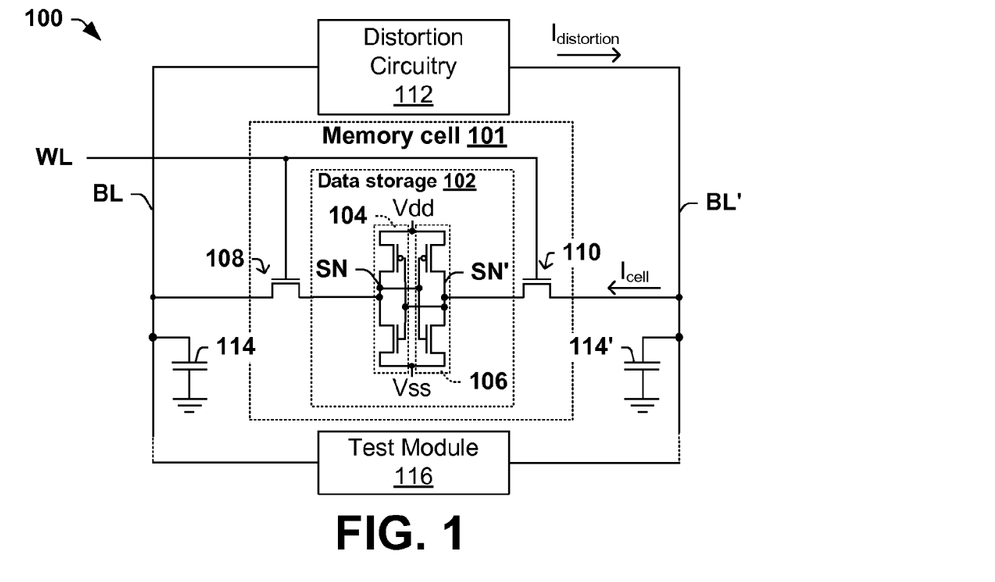
FIG. 1 illustrates a memory device in accordance with some embodiments.

FIG. 1 shows a memory device 100 in accordance with some embodiments. A memory cell 101 in the memory device includes a data storage element 102 having a pair of cross coupled inverters 104, 106, wherein first and second storage nodes SN, SN' are coupled there between. First and second access transistors 108, 110 have their respective sources coupled to the first and second storage nodes SN, SN', respectively, and have their respective drains coupled to first and second bitlines BL, BL', respectively. Because the access transistors provide bi-directional current flow, it will be appreciated that the terms "source" and "drain" are somewhat arbitrary here and could be exchanged. A wordline WL is coupled to the respective gate terminals of the access transistors 108, 110, wherein the wordline WL is selectively asserted to selectively couple the first and second storage nodes SN, SN' to the first and second bitlines BL, BL', respectively. As will be appreciated in more detail below, the memory device 100 also includes distortion circuitry 112 coupled to the first and second bitlines BL, BL'. To test a read margin or write margin of the memory cell 101, this distortion circuitry 112 is configured to apply incremental distortion levels (e.g., different distortion potentials and distortion currents) to at least one of the first or second bitlines BL, BL'.

Because of manufacturing variation/imperfections during production, the transistors of the cross-coupled inverters 104 and 106 are not perfectly identical. As a result, different memory cells will be able to tolerate different distortion levels without flipping the data states stored in the cells. For example, for some memory cells, the inverters 104, 106 can absorb the current and voltage corresponding to a first distortion level without flipping the data values stored in the cells, but the cells will flip when a second, larger distortion level is applied. However, other memory cells may have inverters 104, 106 that are sufficiently symmetric to withstand both the first and second distortion levels without flipping the data values stored in the other cells. Still other memory cells, in which the inverters are particularly asymmetric, may have their data flipped when either the first or second distortion level is applied. Whatever the case, a test module 116 (e.g., such as an on-chip BIST module or external automated test equipment), can then analyze and store the results of this incremental distortion testing.

Figure 2:
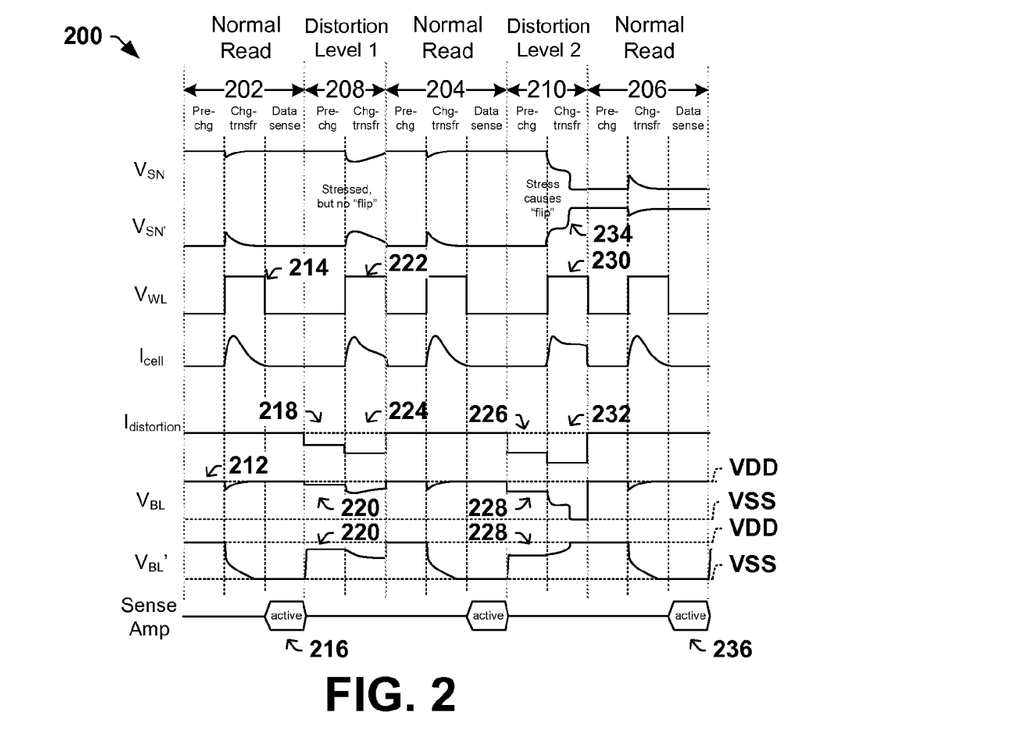
FIG. 2 is a timing diagram illustrating one manner of testing a read margin of a memory cell in accordance with some embodiments.

FIG. 2 shows a series of waveforms 200 consistent with some embodiments. In particular, FIG. 2 shows three normal read operations (202, 204, 206), and two distortion operations (e.g., a first "weak" distortion operation 208, and a second "strong" distortion operation 210). As will be more fully appreciated below, these waveforms 200 illustrate one manner in which the distortion circuitry 112 can apply different distortion levels in the form of different distortion potentials and different distortion currents to at least one of the bitlines BL, BL' to incrementally test the read margin for the memory cell 101 of FIG. 1.

Prior to the illustrated operations of FIG. 2, the memory cell 101 stores an expected data state which was previously written to the cell. In FIG. 2's implementation, for example, the first and second storage nodes SN, SN' store an expected data state in which the storage node voltage ($V_{SN}$) is high and the complementary storage node voltage ($V_{SN'}$) is low, corresponding a logical "1" expected data state for example.

During the normal read operation 202, parasitic capacitances (114, 114', FIG. 1) of bitlines BL, BL' are pre-charged to a high voltage (e.g., VDD) at 212. After pre-charging is complete, a charge transfer state is initiated by asserting the wordline WL at 214. Because $V_{SN}$ is initially high due to the expected data state initially stored in the memory cell, the n-type transistor in inverter 106 is initially active, which causes current $I_{cell}$ to flow as $V_{SN'}$ and pre-charged bitline $V_{BL'}$ are pulled low. Once $V_{SN'}$ and $V_{BL'}$ are pulled low, the storage nodes SN, SN' again reach a stable complementary voltage condition which is mutually reinforced by the inverters 104, 106. The wordline WL is then de-asserted at 214, and a data sense state is initiated at 216. During 216, a sense amp is activated to detect an actual data state read from the cell, as reflected by the bitline voltages $V_{BL}/V_{BL}'$ (e.g., in FIG. 2 where $V_{BL}$ is high and $V_{BL'}$ is low, corresponding to a logical "1" data state being read from the memory cell). Because the actual data state read from the cell is the same as the expected data state in FIG. 2, the normal read operation in 202 returns a "correct" result.

The first distortion operation is then carried out in 208. During this first distortion operation, the distortion circuit 112 drives a current through the bitlines at 218, thereby setting both the bitlines BL and BL' to a first substantially constant distortion potential 220. While this first distortion potential 220 is established, both bitlines have the same potential—which at this time is less than VDD. After the bitlines have settled at this first distortion potential 220, the wordline WL is asserted at 222 to couple the bitlines to their respective storage nodes. While the wordline WL is asserted, the distortion circuit 112 drives a first distortion current 224 on at least one bitline. This first distortion current 224 opposes the read current output from the cross-coupled inverters of the cell (e.g., $I_{cell}$ in FIG. 1). In FIG. 2's embodiment, for example, the cell current $I_{cell}$ tends to pull down the voltage on BL', while the first distortion current 224 tends to pull up the voltage on BL'. Nonetheless, the following normal read operation 204 still provides a "correct" result. The cell has not been "flipped" by the first distortion operation 208, as confirmed by the second normal read operation 204.

The second (stronger) distortion operation is subsequently carried out at 210. During this second distortion operation 210, the distortion circuit provides a second current at 226 to set the bitlines BL and BL' to a second substantially constant second distortion potential 228 (e.g., 35% less than VDD). During 228, the voltage of both bitlines is again the same, which is now less than VDD, this time by a larger amount than the potential of the bitline for the first distortion potential 220. After the bitlines have settled at the second distortion potential 228, the wordline is asserted at 230 and the distortion circuit 112 supplies a second distortion current 232 to the bitlines, wherein the second distortion current has a larger magnitude than the first distortion current 224. For the illustrated cell, the pmos transistor of inverter 104 is not large enough to absorb the second distortion current 232 such that the second distortion operation forces node SN down and causes the storage nodes to "flip" at 234. Hence, the actual data state read from the memory cell during a subsequent normal read operation 206 differs from the expected data state, and it is thereby inferred that the second distortion operation 232 caused the data to flip. The test module 116 can store the second distortion level as a measure of the strength of memory cell 100.

Figure 3:
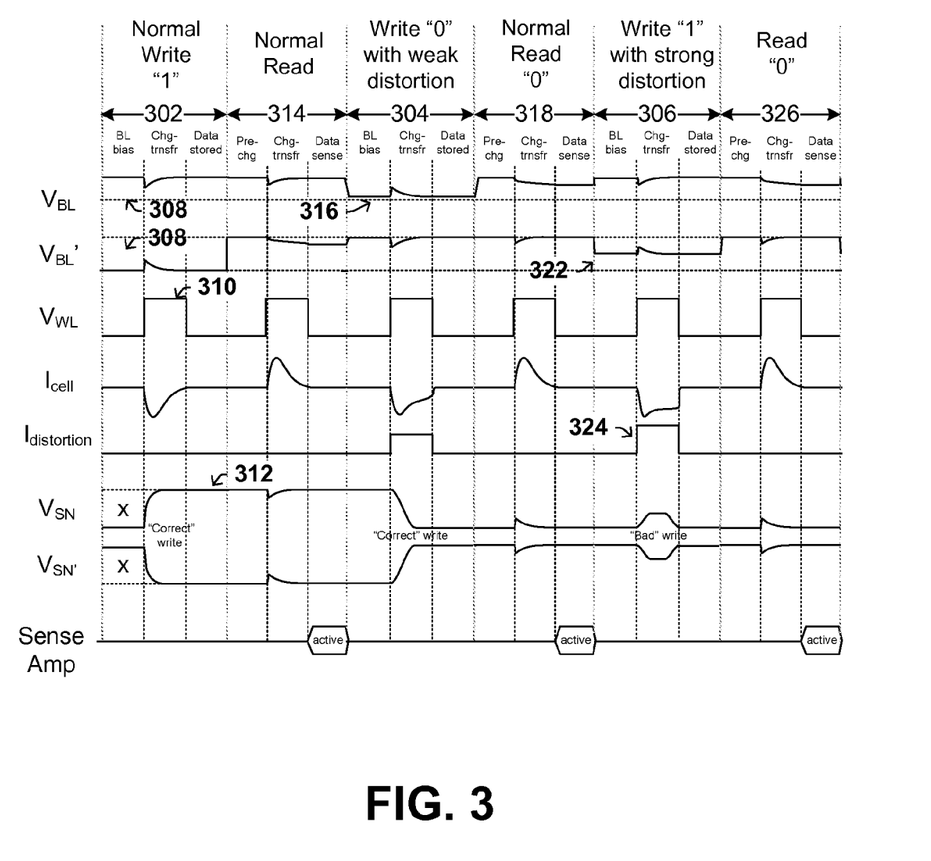
FIG. 3 is a timing diagram illustrating one manner of testing a write margin of a memory cell in accordance with some embodiments.

As now discussed with reference to FIG. 3, the distortion circuitry 112 can also be used to test the write margins of a memory cell. As opposed to FIG. 2's read operations where the cross-coupled inverters 104, 106 drove the voltage on the bitlines BL, BL'; in FIG. 3 the bitlines are driven so as to set the data state stored in the cross-coupled inverters. In this context, the distortion circuit 112 can distort the energy on the bitlines to stress the write margins of the memory cell. Three illustrative write operations (a normal write operation 302, a write operation with a first distortion level 304, and a second write operation with a second distortion level 306), are now described below.

During the normal write operation 302, the bitlines are biased at 308 based on the data state to be written to the memory cell. For example, to write a "1" at 302, $V_{BL}$ is driven to 1 and $V_{BL}'$ is driven to 0. While the bitlines are biased, the wordline is asserted at 310 such that charge is transferred between the bitlines BL, BL' and storage nodes SN, SN', respectively to program the memory cell with the desired data state at 312. A normal read operation 314 confirms the expected data state was actually written to the cell.

During the distorted write operations 304 and 306, the bitlines are again initially biased to correspond to the desired state to be written to the memory cell. However, during the first (weak) distortion 304, the potential on BL is slightly above VSS, (see 316 in view of 308) and the potential on BL' is at VDD. This slightly above-VSS potential on BL reduces the overall bias applied to the cross-coupled inverters when programming the cell during the charge transfer state. A normal read operation in 318 confirms that the correct value was, in fact, written to the cell.

In contrast, in the second distorted write operation 306, the voltage on BL' is raised even more (see 322 in view of 308/ 314) during the bitline bias phase and an even larger distortion current is applied (see 324). This second distortion is so large that the charge provided to write a new data state to the cell is not sufficient to "flip" the state on the storage nodes SN and SN'. As a result, no new data is written to the cell. Consequently, when a subsequent read operation occurs at 326, an actual data value of "0" is read from the cell, but a "1" value was expected. Hence, the second distortion level in 306 can be stored as a measure of the strength of memory cell.

Figure 4:
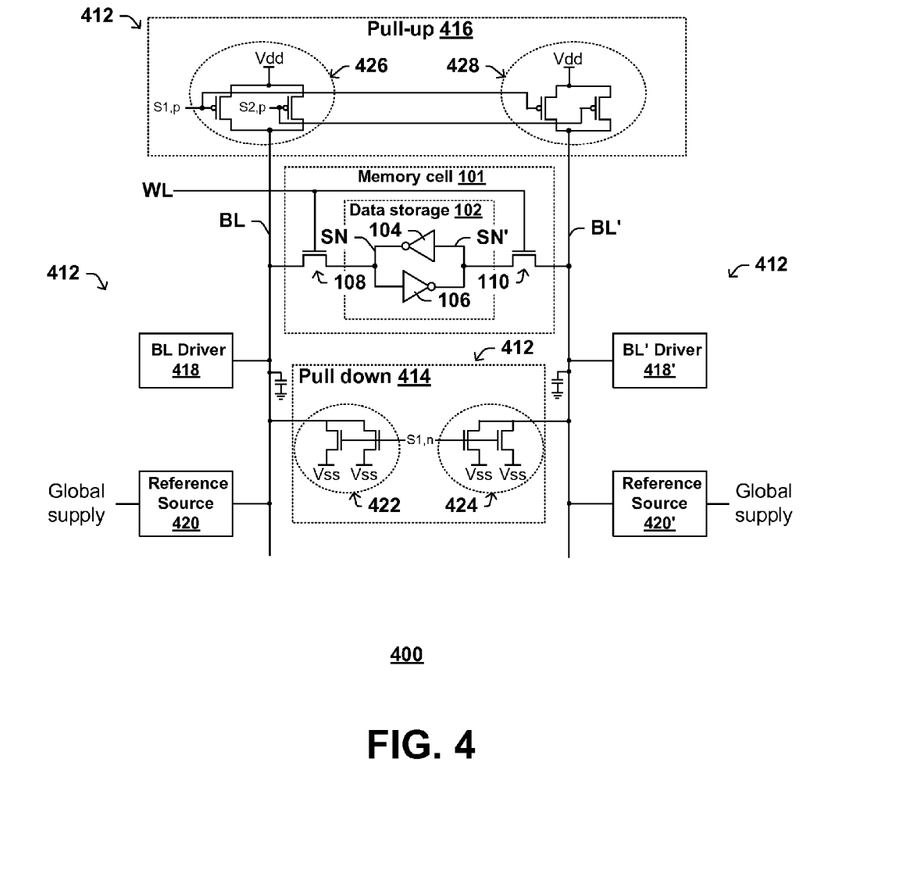
FIG. 4 is a memory device in accordance with some embodiments.

FIG. 4 shows another embodiment of a memory device 400 in accordance with some implementations. The memory device can include pull down circuitry 414, pull-up circuitry 416, and/or bitline driver circuitry 418, 418'. Any of these circuits (e.g., 414, 416, and/or 418/418') can receive appropriate control signals to provide incremental distortion levels, and thereby act as distortion circuitry as contemplated herein (e.g., distortion circuitry 112 of FIG. 1). Further, in other embodiments a separate reference source (e.g., 420 or 420') can deliver charge to at least one of the bitlines from a global supply. Thus, if present, a reference source (e.g., 420 or 420') can also constitute distortion circuitry as contemplated herein (e.g., distortion circuitry 112 of FIG. 1). For example, for write margin testing, a single reference source (e.g., 420) can deliver charge from the global supply to establish a reference voltage between VDD and VSS on a single bitline (e.g., BL). For read margin testing, by contrast, two reference sources (e.g., 420, 420') can deliver charge from the global supply to establish a reference voltage between VDD and VSS on both bitlines (e.g., BL, BL'). Thus, it will be appreciated that although some embodiments include all of these components 414-420 to achieve both read margin and write margin testing, other embodiments are characterized by the absence of one or more of these components.

In addition, to carry out the distortion operations in accordance herewith, any of these components 414-420 can act as "pre-charge circuitry". In accordance with the ordinary meaning ascribed to the term "pre-charge" as understood by a person of ordinary skill in the art, "pre-charge" circuitry can pull a bitline up or down, so long as it does so with respect to a pre-determined amount of charge. Further, this pre-charge circuitry can include one or more pre-charge elements (e.g., one or more pull-up elements, such as a pmos transistor; one or more pull-down elements, such as an nmos transistor; one or more reference sources; and/or a combination of pull-up elements and/or pull-down elements and/or reference sources).

The illustrated pull down circuit or element 414 includes a number of n-type transistors, arranged in a first group 422 and a second group 424. The first group of transistors 422 are arranged in parallel with one another and are coupled to the first bitline BL, while the second group of transistors 424 are arranged in parallel with one another and are coupled to the second bitline BL'. Although FIG. 4 shows only two n-type transistors coupled in parallel to each bitline, it is to be appreciated that any number of n-type transistors ranging from one up to nearly infinity could be coupled to each bitline. Further, although the illustrated embodiment shows a transistor in the first group 422 having its gate tied to a gate of a transistor in the second group 424, in other embodiments, each transistor in the first group 422 is assertable independently of each transistor in the second group 424 to provide a wide range of bias conditions. Providing each transistor with a separately assertable gate provides a wider, more flexible range of bias conditions that can be applied by the pull down circuit, but also tends to consume more area due to wiring requirements and the like.

The illustrated pull-up circuit or element 416 includes a number of p-type transistors, arranged in a third group 426 and a fourth group 428, which also allows for multiple "stress" levels to be used. The third group of transistors 426 are arranged in parallel with one another and are coupled to the first bitline BL, while the fourth group of transistors 428 are arranged in parallel with one another and are coupled to the second bitline BL'. Although FIG. 4 shows only two p-type transistors coupled in parallel to each bitline, it is to be appreciated that any number of p-type transistors ranging from one up to nearly infinity could be coupled to each bitline. Further, although the illustrated embodiment shows a transistor in the third group 426 having its gate tied to a gate of a transistor in the fourth group 428, in other embodiments, each transistor in the third group 426 is assertable independently of each transistor in the fourth group 428 to provide a wide range of bias conditions. Providing each transistor with a separately assertable gate provides a wider, more flexible range of bias conditions that can be applied by the pull down circuit, but also tends to consume more area due to wiring requirements and the like.

The distortion potentials (e.g., 220/228 in FIG. 2) and/or distortion currents (e.g., 224/232 in FIG. 2) applied to at least one of the first or second bitlines can be iteratively adjusted (e.g., by asserting different combinations of transistors in the first, second, third, and fourth groups 422-428) to test different read or write margins. For each iteration, the memory device can check whether the actual data value read from the data storage element corresponds to an expected data value. By iteratively comparing the actual and expected data values, read and write failure conditions for the data storage element 402 can be determined.

Figure 5:
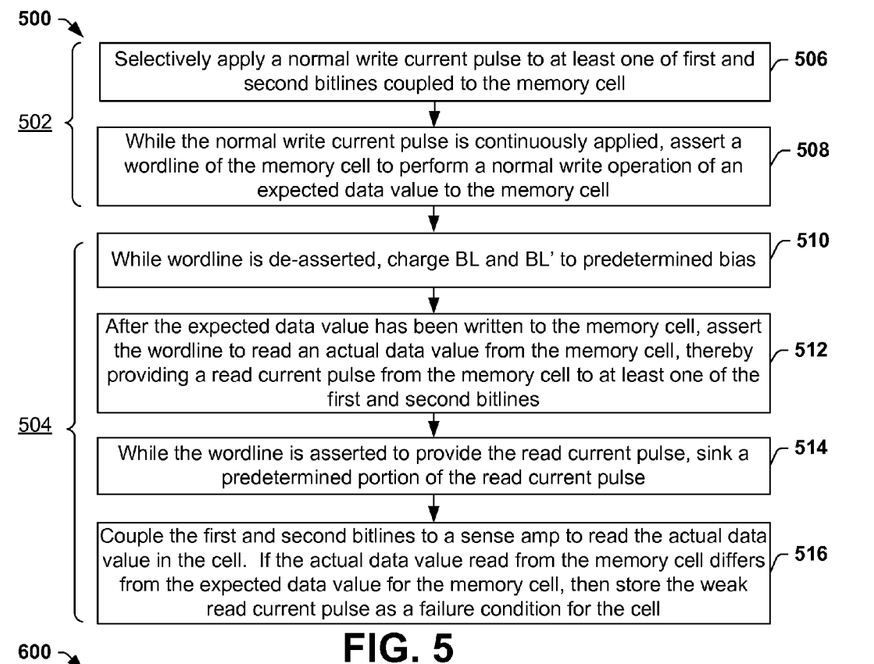
FIG. 5 is a flow diagram of a memory access operation that includes a weak read operation in accordance with some embodiments.
Figure 6:
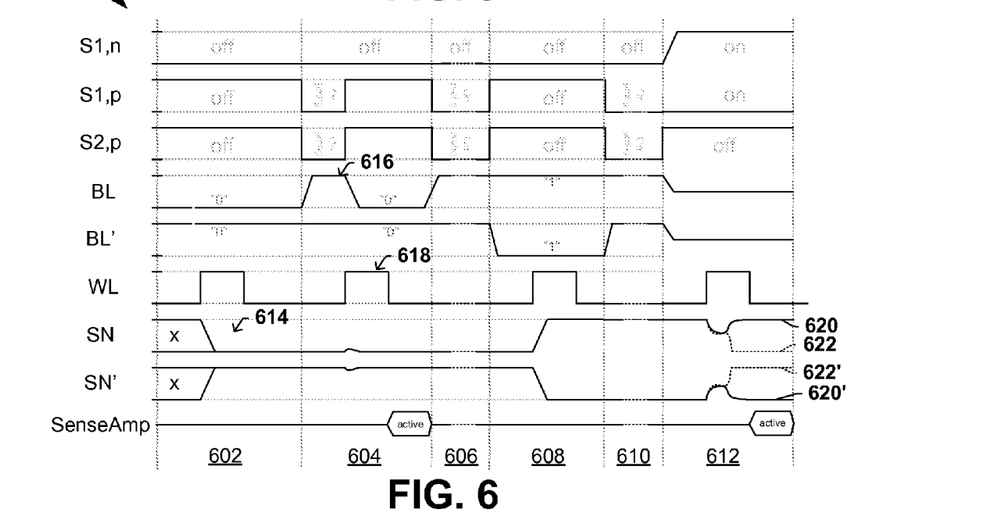
FIG. 6 is an example timing diagram.
Figure 7:
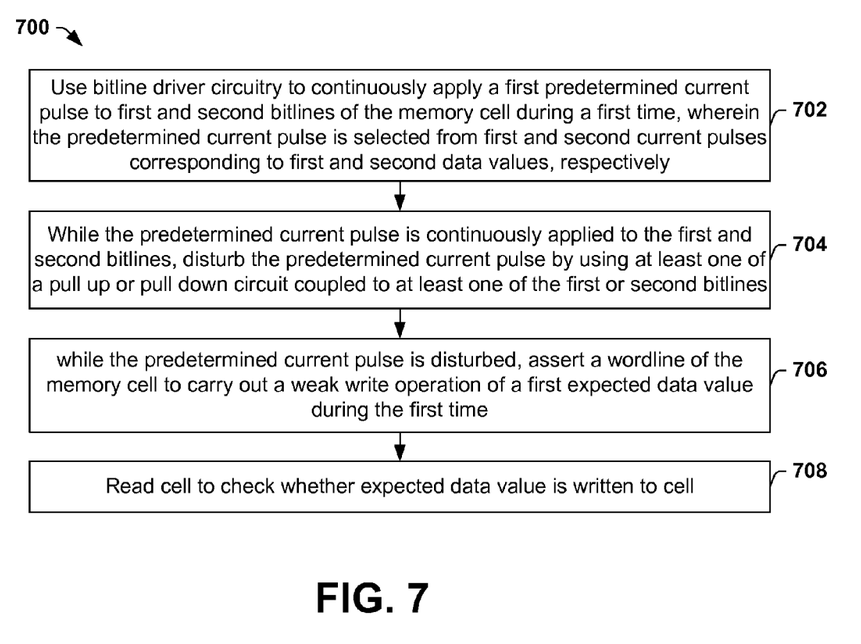
FIG. 7 is a flow diagram of a memory access operation that includes a weak write operation in accordance with some embodiments.
Figure 8A:
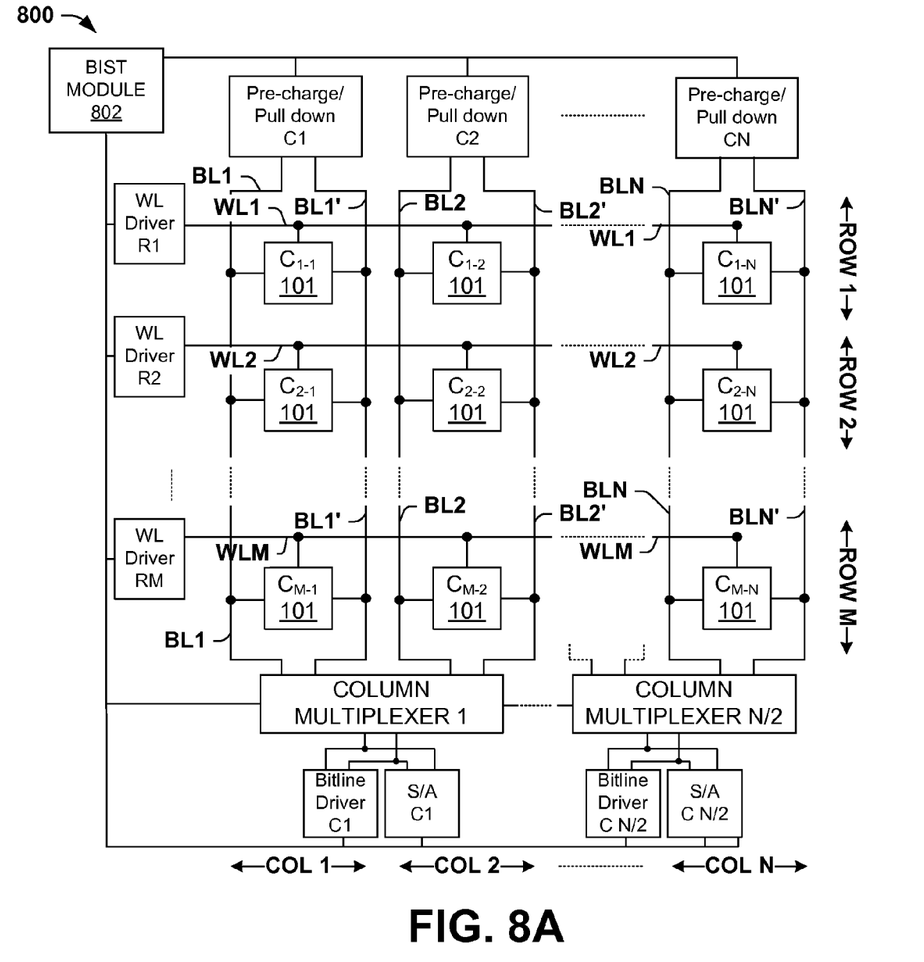
FIGS. 8A-8B are block diagrams of a memory device that includes an array of memory cells in accordance with some embodiments.
Figure 8B:
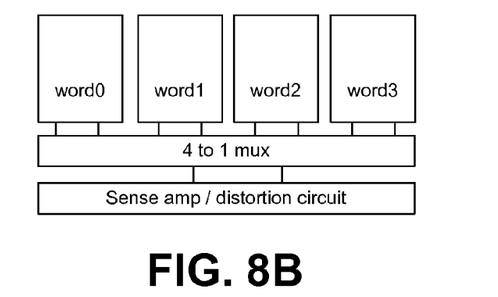

Additional examples of how read and write margins can be tested will be described with regards to FIGS. 5-8. FIGS. 5-6 illustrate example weak read operations, and FIGS. 7-8 illustrate example weak write operations. Although these examples are illustrated and described below as a series of acts, events, or waveforms, the present disclosure is not limited by the illustrated ordering of such acts, events, or waveforms. The same is true for other methods disclosed herein. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

Turning now to FIG. 5, one can see memory access method 500 that includes a normal write operation 502 followed by a weak read operation 504.

The normal write operation 502 starts at 506 when a predetermined current pulse is applied to at least one of first and second bitlines coupled to the memory cell. The predetermined current pulse is selected from first and second current pulses corresponding to first and second data values, respectively. This predetermined current pulse can be provided by a bitline driver circuit (e.g., 418 and/or 418' in FIG. 4). At 508, while the normal write current pulse is continuously applied, a wordline of the memory cell is asserted to perform a normal write operation of an expected data value to the memory cell.

The weak read operation 504 starts at 510 when the wordline is deasserted and BL and BL' are pre-charged to a predetermined bias.

After the bitlines have settled the wordline is asserted at 512 to read an actual data value from the memory cell. When the wordline is asserted, cross-coupled inverters in the memory cell provide a read current pulse from the memory cell to at least one of the first and second bitlines, wherein the read current pulse depends on the data value stored in the memory cell.

To "weaken" the read current pulse and thereby test the read margin for the cell, some of the read current pulse from the at least one bitline is sunk at 514 (e.g., by using pull down circuitry 414 in FIG. 4). The weak read operation continues at 516, when the first and second bitlines are coupled to a sense amp to read the actual data value in the cell.

If the actual data value read from the memory cell differs from the expected data value for the memory cell, then the weak read current pulse is stored as a failure condition for the cell. The amount of current sunk from the read current pulse can be iteratively adjusted (e.g., by using different combinations of the transistors within pull up and pull down circuitry 414, 416, which establish a variable resistive divider in FIG. 4), to accurately characterize a read margin for the memory cell.

FIG. 6 shows a more detailed timing diagram 600 consistent with FIG. 5's embodiment. The timing diagram 600 shows an example where a standard write operation is used to write a "0" to the memory cell (e.g., 502 of FIG. 5) during 602, and then a standard read is performed during 604. If the cell is functioning properly, the standard read during 602 will return a "0" as the value stored in the cell. After an optional idle cycle during 606, an optional standard write of "1" during 608, and another optional idle cycle during 610; a weak read operation is carried out in 612 to test the "strength" of the data state stored in the cell. It will be appreciated that although an example combination of "1" and "0" states have been chosen in the illustrated example, other combinations of data states could be used instead.

More particularly, the normal write operation is carried out during 602 by applying a first current pulse to the bitlines BL, BL'. During time 602, the first current pulse establishes a relatively low DC voltage on BL (e.g., $V_{SS}$) and a relatively high DC voltage on BL' (e.g., $V_{DD}$). While the current pulse is applied, the wordline WL is asserted, thereby driving the first storage node SN to a relatively low DC voltage and driving the second storage node SN' to a relatively high DC voltage at 614. Cross-coupled inverters in the memory cell mutually reinforce this data state (e.g., "0") once it is present on the storage nodes SN, SN'. At the end of the normal write 602, the WL returns to a de-asserted state, and the expected data state is latched in the memory cell.

Next, a standard read operation is carried out during 604. To facilitate a read operation, bitlines BL, BL' are first pre-charged at 616 to a relatively high DC voltage (e.g., VDD). After pre-charging is complete, the bitlines BL, BL' are floated and the wordline WL is asserted at 618, which couples the storage nodes SN, SN' to the bitlines BL, BL', respectively. Consequently, cross-coupled inverters in the memory cell drive (which are already driving storage nodes SN, SN' to "0", "1" states, respectively) pull BL low and leave BL' high. The wordline is then de-asserted, after which the sense amp is activated to measure the charge on the bitlines BL, BL' and determine a "0" was stored in the memory cell. In this example, the memory cell is operating properly at this time, because the data state expected to be written to the cell during 602 has been read back during time 604.

After an optional idle phase occurs during 606, which again pre-charges the bitlines to the relatively high DC voltage, a standard write of a "1" data state is optionally carried out during 608. After another optional idle state in which the bitlines are pre-charged during 610, a weak read is carried out in 612.

During the weak read 612, the wordline WL is asserted concurrently with both the pull down circuitry (e.g., S1, n of 414 in FIG. 4) and a subset of transistors in pull-up circuitry (e.g., S1, p of 416 in FIG. 4). This bias condition applies an intermediate current and voltage condition to the cross-coupled inverters via the bitlines BL, BL'. Whether this weak read operation in fact reads the expected value from the memory cell depends on whether the inverters of the cell are able to retain the expected data state despite the distortion due to the pull down circuitry. For example, if cross-coupled inverters are strong enough to retain the expected state (as shown by lines 620, 620'), the correct data value is read. However, if the cross-coupled inverters are too weak to retain the expected data state (as shown by lines 622, 622'), the actual data value from the cell will differ from the expected data value.

Turning now to FIG. 7, one can see a weak write operation 700 in accordance with some aspects of the present disclosure. The method 700 starts at 702, where bitline driver circuitry (e.g., 418, 418' in FIG. 4) continuously applies a first predetermined current pulse to first and second bitlines of the memory cell during a first time. The predetermined current pulse is selected from first and second current pulses corresponding to first and second data values, respectively.

At 704, while the predetermined current pulse is continuously applied to the first and second bitlines, the predetermined current pulse is disturbed or altered by using at least one of a pull up or pull down circuit coupled to at least one of the first or second bitlines.

At 706, while the predetermined current pulse is disturbed, a wordline of the memory cell is asserted to carry out a weak write operation of a first expected data value during the first time.

At 708, the cell is read to check whether expected data value was successfully written to cell.

FIG. 8A shows an example of a memory device 800 that includes an array of memory cells arranged in N columns and M rows. Cells along a given row are coupled to a shared wordline, and cells along a given column share a pair of complementary bitlines. For example, memory cells C1-1 through C1-N are coupled to wordline WL1, and can be written to or read from by asserting WL1. While WL1 is asserted, a write operation is performed by applying suitable voltages to the bitlines BL1-BLN' via corresponding bitline drivers, where the applied bitline voltages are representative of a data value to be written to the memory cell attached to corresponding complementary bitlines. Column-multiplexers connect one pair of bit-lines out-of a larger number of bit-lines to one set of BL driver and SA—as shown in FIG. 8B.

A BIST module 802 is configured to apply a predetermined set of stimulus vectors to control the bitline drivers, wordline drivers, pre-charge circuits, pull down circuits and other elements, to carry out desired BIST testing. It will be appreciated that such BIST testing can be carried out just after fabrication, or can alternatively be carried out from time to time after the memory has been distributed to an end user.

As shown in FIG. 8B, in some embodiments the memory cells of a memory array can be arranged into multiple words across a given row (e.g., 4 words as shown in FIG. 8B). In such instances, a sense amp and/or distortion circuit can be shared between the multiple words. Thus, a single distortion circuit can be used for multiple rows, for example, which reduces the amount of gates (and power in many instances) needed to implement the overall memory device.

The following procedure may be carried out on the memory devices of FIG. 8A or 8B to determine the presence of "weak cells".

First, MBIST write operations are performed without distortion to produce an expected data pattern in the memory array Second, MBIST normal read operations are performed to verify whether all memory cells return the expected data pattern for normal read and write margins. If unexpected results are returned, the corresponding cells can be rechecked and/or marked as faulty.

Next, MBIST read operations with a first level of distortion are performed to verify whether the memory cells return expected results under the first distortion level. To the extent there is any difference between the actual data pattern read from the device and the expected data pattern, the level of disturbance is recorded, optionally along with the address of the corresponding "weak" cells. If all data is correct, the memory is set to use the next higher level of disturbance for read operations, and again reads the cells to check whether the actual data pattern read from the array is the same as the expected data pattern. The procedure can continue in this manner with successive increases in distortion level, until "weak" cells are detected or until all cells provide correct data up to some predetermined (e.g., maximum) distortion level is reached. This procedure may be carried out independently with appropriate settings for write distortion.

A more complex procedure allows for the determination of a cell stability distribution. In this procedure, MBIST is used to write a data pattern without distortion to the memory device producing a known content of the memory array. Next, a first read distortion level is applied to the cells and MBIST read operations are used to check the effect on the expected data pattern. Next, if the actual data pattern read from the memory array differs from the expected data pattern, the distortion level is recorded as a relevant limit of disturbance. The method can also optionally record the address of the cell(s) that failed. Next, if higher levels of distortion are configurable, the next higher level of disturbance is applied and the results are again checked. This procedure may be carried out independently with appropriate settings for write distortion.

Although the disclosure has been shown and described with respect to one or more implementations, equivalent alterations and modifications will occur to others skilled in the art based upon a reading and understanding of this specification and the annexed drawings. For example, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. A memory device, comprising:
    a memory cell comprising: a pair of cross-coupled inverters configured to cooperatively store at least one bit of data, and first and second access transistors having their respective sources coupled to respective inputs of the inverters;
    first and second bitlines coupled to respective drains of the first and second access transistors, respectively;
    a wordline coupled to first and second gates of the first and second access transistors, respectively;
    first and second bitline drivers coupled to the first and second bitlines, respectively; the first and second bitline drivers configured to selectively assert a predetermined current pulse to the first and second bitlines based on an expected data state to be written to the memory cell; and
    distortion circuitry coupled to the first and second bitlines and configured to add current to or subtract current from at least one of the first or second bitlines while the wordline is asserted to test a write or read margin of the memory cell;
    wherein the distortion circuitry comprises pre-charge circuitry coupled to at least one of the first and second bitlines, wherein the pre-charge circuitry is configured to deliver a pre-determined charge to the at least one bitline in order to test the write or read margin of the memory cell; and
    wherein the pre-charge circuitry comprises: pull down circuitry coupled to at least one of the first and second bitlines and configured to selectively add or subtract the current from the at least one of the first and second bitlines to test the write or read margin.

2. The memory device of claim 1, wherein the pre-charge circuitry comprises:
    a first plurality of pre-charge elements arranged in parallel with one another and coupled to the first bitline; and
    a second plurality of pre-charge elements arranged in parallel with one another and coupled to the second bitline.

3. The memory device of claim 2, wherein the first plurality of pre-charge elements are each separately assertable from the second plurality of pre-charge elements.

4. The memory device of claim 2, wherein at least one of the first plurality of pre-charge elements has a control terminal tied to a control terminal of at least one of the second plurality of pre-charge elements.

5. The memory device of claim 1, wherein the pull down circuitry comprises:
    a first plurality of pull down elements arranged in parallel with one another and coupled to the first bitline; and
    a second plurality of pull down elements arranged in parallel with one another and coupled to the second bitline.

6. The memory device of claim 5, wherein the first plurality of pull down elements are each separately assertable with respect to each of the second plurality of pull down elements.

7. The memory device of claim 5, wherein at least one of the first plurality of pull down elements has a control terminal tied to a control terminal of at least one of the second plurality of pull down elements.

8. The memory device of claim 1, wherein the pre-charge circuitry comprises:
    pull up circuitry coupled to at least one of the first and second bitlines and configured to selectively add or subtract the current from the at least one of the first and second bitlines to test the write or read margin.

9. The memory device of claim 8, wherein the pull up circuitry comprises:
    a first plurality of pull up elements arranged in parallel with one another and coupled to the first bitline; and
    a second plurality of pull up elements arranged in parallel with one another and coupled to the second bitline.

10. The memory device of claim 9, wherein the first plurality of pull up elements are each separately assertable with respect to each of the second plurality of pull up elements.

11. The memory device of claim 9, wherein at least one of the first plurality of pull up elements has a control terminal tied to a control terminal of at least one of the second plurality of pull up elements.

12. The memory device of claim 1, wherein the distortion circuitry comprises:
pre-charge circuitry coupled to the first and second bitlines, wherein the pre-charge circuitry is configured to add current to or subtract current from at least one of the first and second bitlines while both the predetermined current pulse and the wordline are asserted to test a write margin of the memory cell.

13. The memory device of claim 1, further comprising:
built in self test (BIST) control circuitry configured to iteratively increase an amount of current added to or subtracted from the at least one of the first or second bitlines and further configured to check whether an actual data value corresponds to an expected data value for each iteration.

14. The memory device of claim 1, wherein the pre-charge circuitry comprises:
a reference source configured to deliver charge from a global supply to establish a reference voltage between VDD and VSS on the at least one of the first and second bitlines.

15. A method of built-in self testing (BIST) for a memory cell, comprising:
writing an expected data value to the memory cell by applying a write bias across first and second bitlines coupled to the memory cell;
after the expected data value has been written, pre-charging both the first and second bitlines coupled to the memory cell to the same first distortion potential, wherein the first distortion potential lies between VDD and VSS;
after first and second bitlines are pre-charged to the first distortion potential, asserting a wordline of the memory cell to provide a read current pulse from the memory cell to at least one of the first and second bitlines and concurrently applying a first distortion current to at least one of the first and second bitlines;
subsequently reading an actual value from the memory cell to determine whether the first distortion potential and the first distortion current undesirably altered the expected data value previously written to the memory cell.

16. The method of claim 15, wherein subsequently reading the memory cell comprises:
de-asserting the wordline after the read current pulse;
while the wordline is de-asserted, pre-charging the first and second bitlines to VDD;
asserting the wordline after the first and second bitlines have been pre-charged to VDD to read the actual data value from the memory cell; and
coupling the first and second bitlines to a sense amp to read the actual data value in the cell.

17. The method of claim 15, further comprising:
based on whether the expected data value was undesirably altered, selectively storing a distortion level corresponding to at least one of the first distortion bias or the first distortion current as a failure level for the memory cell.

18. The method of claim 15, further comprising:
pre-charging both the first and second bitlines to the same second distortion potential, wherein the second distortion potential lies between VDD and VSS and differs from the first distortion potential;
after first and second bitlines are pre-charged to the second distortion potential, asserting the wordline to provide a second read current pulse from the memory cell to at least one of the first and second bitlines and concurrently applying a second distortion current to at least one of the first and second bitlines;
subsequently reading a second actual value from the memory cell to determine whether the second distortion potential and the second distortion current undesirably altered the expected data value previously written to the memory cell.

19. A memory device, comprising:
a memory cell comprising: a pair of cross-coupled inverters configured to cooperatively store at least one bit of data, and first and second access transistors having their respective sources coupled to respective inputs of the inverters;
first and second bitlines coupled to respective drains of the first and second access transistors, respectively;
a wordline coupled to first and second gates of the first and second access transistors, respectively;
first and second bitline drivers coupled to the first and second bitlines, respectively; the first and second bitline drivers configured to selectively assert a predetermined current pulse to the first and second bitlines based on an expected data state to be written to the memory cell; and
distortion circuitry coupled to the first and second bitlines and configured to add current to or subtract current from at least one of the first or second bitlines while the wordline is asserted to test a write or read margin of the memory cell;
wherein the distortion circuitry comprises pre-charge circuitry coupled to at least one of the first and second bitlines, wherein the pre-charge circuitry is configured to deliver a pre-determined charge to the at least one bitline in order to test the write or read margin of the memory cell; and
wherein the pre-charge circuitry further comprises:
pull up circuitry coupled to at least one of the first and second bitlines;
pull down circuitry coupled to at least one of the first and second bitlines and arranged in series with the pull-up circuitry;
wherein the pull up circuitry and pull down circuitry form a resistive divider arranged to selectively add or subtract the current from the at least one of the first and second bitlines to test the write or read margin.

20. a memory cell comprising: a pair of cross-coupled inverters configured to cooperatively store at least one bit of data, and first and second access transistors having their respective sources coupled to respective inputs of the inverters;
first and second bitlines coupled to respective drains of the first and second access transistors, respectively;
a wordline coupled to first and second gates of the first and second access transistors, respectively;
first and second bitline drivers coupled to the first and second bitlines, respectively; the first and second bitline drivers configured to selectively assert a predetermined current pulse to the first and second bitlines based on an expected data state to be written to the memory cell; and
distortion circuitry coupled to the first and second bitlines and configured to add current to or subtract current from at least one of the first or second bitlines while the wordline is asserted to test a write or read margin of the memory cell;
wherein the distortion circuitry comprises pre-charge circuitry coupled to at least one of the first and second bitlines, wherein the pre-charge circuitry is configured to deliver a pre-determined charge to the at least one bitline in order to test the write or read margin of the memory cell; and wherein the pair of cross-coupled inverters are configured to deliver a read current pulse, which is indicative of an actual data state stored in the memory cell, to at least one of the first and second bitlines while the wordline is asserted; and wherein the pre-charge circuitry subtracts current from the read current pulse to test a read margin of the memory cell.

* * * * *